(12) United States Patent
Esguerra et al.

(10) Patent No.: US 7,011,764 B2
(45) Date of Patent: Mar. 14, 2006

(54) METHOD FOR PRODUCING A MAGNETIC DEVICE

(75) Inventors: Mauricio Esguerra, Unterhaching (DE); Ralph Lucke, Miesbach (DE)

(73) Assignee: Epcos AG, Munich (DE)

( * ) Notice: Subject to any disclaimer, the term of this patent is extended or adjusted under 35 U.S.C. 154(b) by 110 days.

(21) Appl. No.: 10/626,944

(22) Filed: Jul. 25, 2003

(65) Prior Publication Data

US 2004/0016560 A1   Jan. 29, 2004

Related U.S. Application Data

(60) Division of application No. 09/756,530, filed on Jan. 10, 2002, which is a continuation of application No. PCT/DE99/01950, filed on Jul. 1, 1999, now Pat. No. 6,696,638.

(51) Int. Cl.
*H01F 1/00* (2006.01)

(52) U.S. Cl. ............................ 252/62.51 R; 252/62.56; 252/62.55; 252/62.57; 252/62.58; 252/62.59; 252/62.6; 252/62.61; 252/62.62; 252/62.63; 252/62.64; 106/643; 106/640; 106/713; 106/733; 106/772; 106/819

(58) Field of Classification Search ................. 106/643, 106/640, 713, 733, 772, 819; 252/62.51 R, 252/62.56, 62.55, 62.57, 62.58, 62.59, 62.6–62.64

See application file for complete search history.

(56) References Cited

U.S. PATENT DOCUMENTS 4,861,955 A  8/1989  Shen 5,609,788 A * 3/1997 Deetz ..................... 252/62.54
6,696,638 B1 * 2/2004 Esguerra et al. ....... 174/35 MS

FOREIGN PATENT DOCUMENTS

| DE | 877 177 | | 5/1953 |
|---|---|---|---|
| DE | 975 757 | | 8/1962 |
| DE | 28 11 227 | | 9/1978 |
| DE | 37 29 700 A1 | | 3/1989 |
| DE | 39 01 345 A1 | | 11/1991 |
| DE | 3901345 A1 | | 11/1991 |
| EP | 0 376 319 A2 | | 7/1990 |
| EP | 0 393 599 A2 | | 10/1990 |
| EP | 0 394 020 A2 | | 10/1990 |
| EP | 0 785 557 A1 | | 7/1997 |
| FR | 2 738 949 | | 3/1997 |
| GB | 2102405 | * | 2/1983 |
| JP | 05-182811 | * | 7/1993 |
| WO | WO 92/08678 | * | 5/1992 |

OTHER PUBLICATIONS

Patent Abstracts of Japan No. 3-155102, (Mori), Jul. 3, 1991.

* cited by examiner

*Primary Examiner*—C. Melissa Koslow
(74) *Attorney, Agent, or Firm*—Laurence A. Greenberg; Werner H. Stemer; Ralph E. Locher

(57) ABSTRACT

A magnetic device and method for making it involve a magnetic device specifically constructed of grains in a matrix. The matrix may be cement or plaster. The grains have an average diameter that is greater than their magnetic domains. The device may be applied to shielding applications for frequencies ranging from 100 kHz to 10 GHz. The shielding may be applied to walls of a building, consumer products such as magnetic disks, and the like. The grains may be any ferromagnetic material, including ferrite.

8 Claims, 3 Drawing Sheets

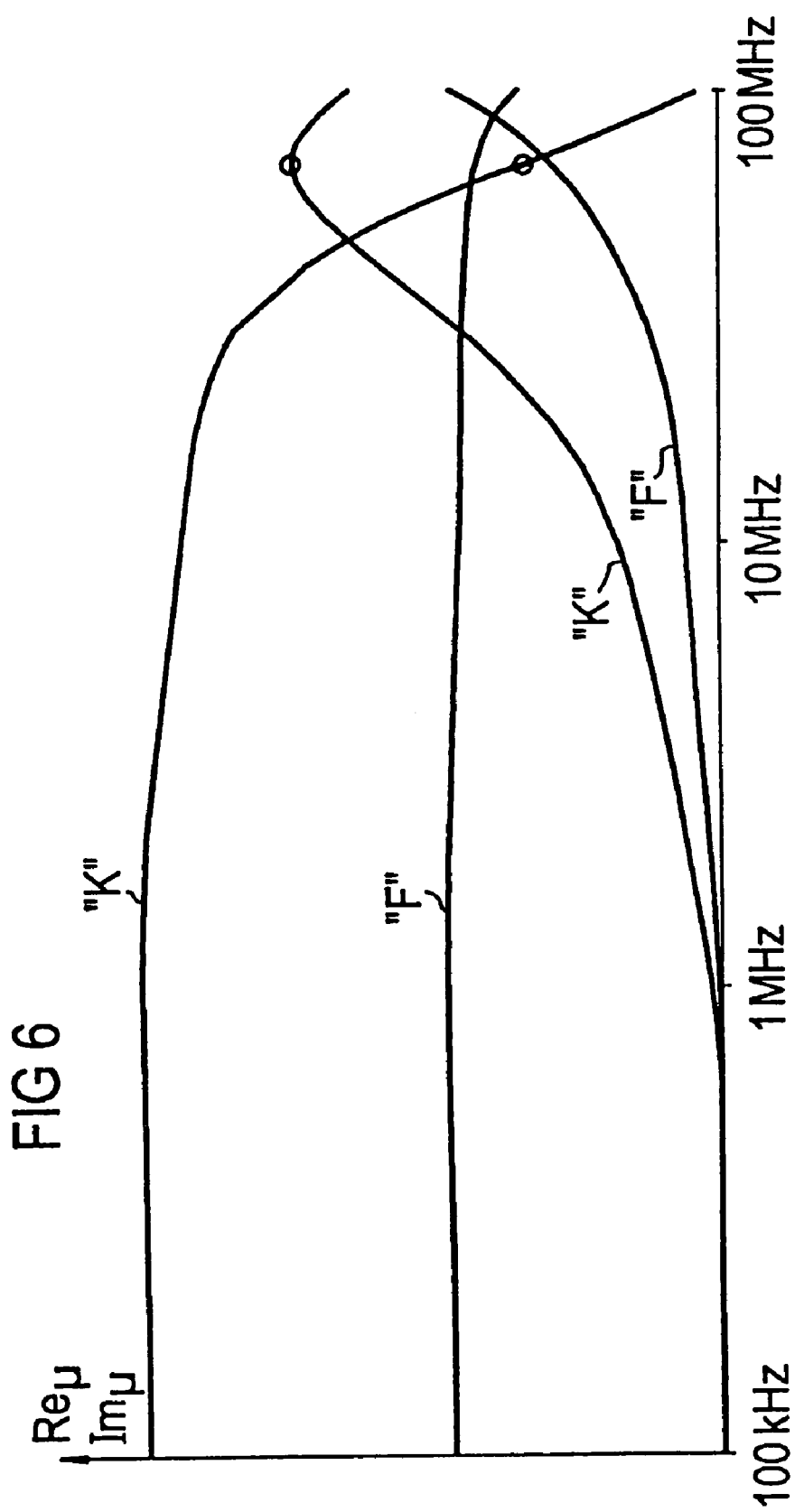

METHOD FOR PRODUCING A MAGNETIC DEVICE

CROSS REFERENCE TO RELATED APPLICATIONS

This is a divisional of U.S. application Ser. No. 09/756,530, filed Jan. 10, 2002, which was a continuation of International application number PCT/DE99/01950, filed Jul. 1, 1999, which designated the United States, and which was not published in English. U.S. application Ser. No. 09/756,530 was issued as U.S. Pat. No. 6,696,638 B2 on Feb. 24, 2004.

BACKGROUND OF THE INVENTION

Field of the Invention

The present invention relates to a method for producing a magnetic device in environments where, for example it is desired to provide for or against the passage of electromagnetic radiation. Such applications may range from a shielding for a cable to a plastering for a wall of a room or rooms. While the present invention will be described with respect to the latter example, applications of the present invention is limited only by the imagination of one skilled in the art. The present invention relates particularly to magnetic material grain size. The related art sets out two examples of consideration of grain size in production and applications.

Reference WO 92/08678 A1 concerns a magnetized product formed by the hardening of cement and water into a malleable mass. Such mass contains granular magnetic materials, including soft iron, thereby displaying certain magnetic properties. The material may be applied in electrical dynamos.

Reference EP 0393599 B1 sets out a surface mounted electrical coil which may be surrounded by a product of synthetic material wherein a powdery magnetic material such as carbonyl iron or ferrite is deposited.

SUMMARY OF THE INVENTION:

Ferromagnetism refers to the physical phenomenon wherein certain electrically uncharged materials strongly attract others. Ferromagnetic materials, when exposed to magnetic fields, become easily magnetized and otherwise display strong magnetic properties. The magnetism in ferromagnetic materials is caused by the alignment patterns of the materials constituent atoms, which act as elementary electromagnets. Ferromagnetic material may be considered as comprising a large number of smaller regions, or domains, wherein the atomic or ionic magnetic moments are aligned. Where the combined moments of the domains are randomly oriented, the ferromagnetic material will not display any significant magnetic properties. However, when an external magnetic field is applied, the moments will rotate into alignment with the field, thereby reinforcing one another and causing magnetic properties of the material as a whole to be displayed. Such alignment continues until a point of saturation, particular to individual ferromagnetic materials. Examples of such materials includes, iron, cobalt, nickel, alloys or compounds containing each, along with some rare earth metals, as known to one skilled in the art.

Ferrite is a ceramic-like ferromagnetic material having a variety of applications. A determining factor of ferrite grain size, in a given material, is its initial permeability which refers to the initial slope of the magnetic flux density (8), established within the material by a magnetizing field, versus the magnetic field strength (H) of the magnetizing field. The slope is typically characteristic of an unmagnetized ferromagnetic material and otherwise represents the magnetic permeability under very small-applied magnetic fields. Magnetic permeability refers to the relative increase or decrease in the resultant magnetic field inside a particular material as compared with the magnetizing field wherein the material may be located. Magnetic permeability is typically assigned the Greek character mu and defined as B/H.

Returning to ferrite, a determination of essential grain size is the initial permeability. The initial permeability of a solid including ferrite therein depends on the ferrite grain size diameter and its relative size with respect to domains of the solid material. A typical domain has a diameter of about 0.5 microns. Where the average grain diameter size of ferrite approaches the size of the domain, initial permeability is reduced. The reduction occurs because the number of domains per grain dramatically drops, such that the alignment of the domains in response to an applied magnetic field discontinues.

It is therefore an object of the invention to set out a method for making it of ferromagnetic material having an elevated or maximized initial permeability. In particular, the material is applicable to shielding for frequencies of above 100 kHz, and in particular 1 MHz to 2 GHz. It is another object of the invention to provide a method which can be implemented so as to enable mass production at reasonable engineering effort and expense and with maximally replicable component characteristics.

The present invention comprises a magnetic device comprising a plurality of ferromagnetic material grains, said grains having a minimum diameter larger than an average domain diameter of said grains, and said grains further embedded in a matrix. The present invention further comprises a method for producing a magnetic device, comprising the steps of: forming ferromagnetic grains, said grains having an average diameter greater than domains of said grains; and embedding said grains in a matrix, said matrix comprising a hardening material.

Other features which are considered as characteristic for the invention are set forth in the appended claims.

Although the invention is illustrated and described herein as embodied in a method for producing a magnetic device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a second diagram depicting permeability materials applied in accordance with the present invention.

DESCRIPTION OF THE PREFERRED EMBODIMENTS

Figure 1:
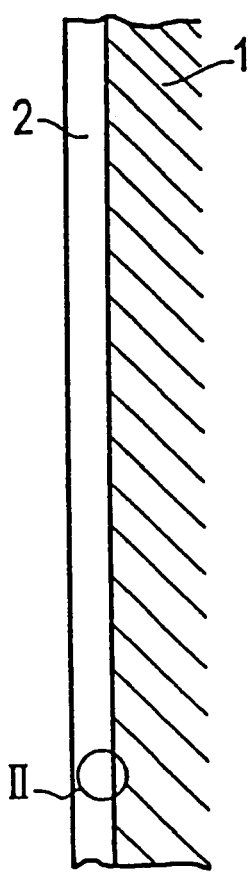
FIG. 1 is a sectional view of the present invention as applied to plaster for a wall.
Figure 2:
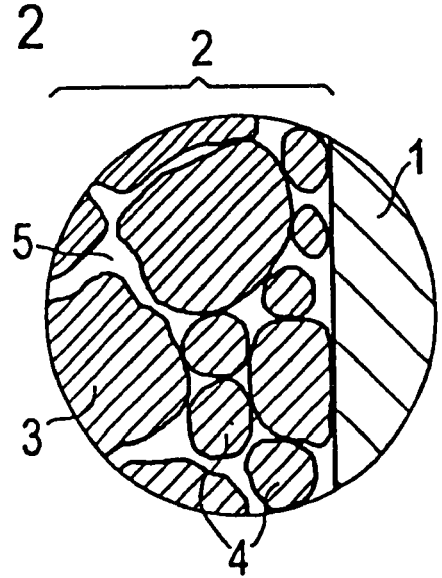
FIG. 2 is an enlarged view of a portion of FIG. 1.

The following sets out an embodiment of the present invention, wherein like reference numerals refer to equivalent functioning elements. FIGS. 1 and 2 depict a similar embodiment of the present invention, namely, application of the invention in a plaster for covering a wall. As shown in FIG. 1, a wall 1 is covered with a plaster 2. The plaster, as will be detailed below, is a shielding against particular electromagnetic frequencies common to modern telecommunications, namely 100 kHz and above. The wall itself may be of any suitable construction envisioned by the skilled artisan, including layers of bricks, cement, and the like. The plaster 2 comprises a shielding and contains grains of ferrite embedded in a matrix. The ferrite may be sintered, iron and the like. FIG. 2 sets out a portion of the shielding, II, in more detail. As shown therein, the shield 2, comprises a plurality of ferrite grains 3, 4 arranged in a matrix 5 of hardened cement. The matrix may comprise equivalent materials envisioned by the skilled artisan to effectively accommodate a ferromagnetic material, such as ferrite, in a shielding matrix formation. The depicted grains 3, 4 have essentially larger diameters than a typical domain diameter of ferrite, namely 0.5 microns. As such, a relatively high initial permeability for the shielding 2 is effected. The size of the grains 3, 4 may range up to 10 millimeters thereby effecting the depicted non-homogeneous shield 2. The grains may have a minimum diameter of about 10 microns and an overall total average diameter of about 100 microns.

In the depicted embodiment, the shielding 2 includes a first number of grains 3 and a second number of grains 4. The first number of grains has an average diameter of about 8 mm and the second number of grains includes an average diameter of about 2 mm. Taken as a group, the discrepancy among the diameters can be relatively high, as for example, for grains 3, the range may be between about 1 mm and 12 mm and for grains 4, the range may be between about 0.1 mm and 6 mm. The depicted matrix may be constructed of cement, as may be manufactured by AALBOG PORTLAND A/S of Aalborg, Denmark and may include fine-granular component material such as silizimudioxide, aluminum oxide, calcium and other related materials as well as a surface active medium to elevate the flow ability of the cement ferrite matrix mass. An advantageous arrangement includes using cement, which requires relatively little water, as compared with other available cements, so as to avoid pores within the matrix 5.

Figure 3:
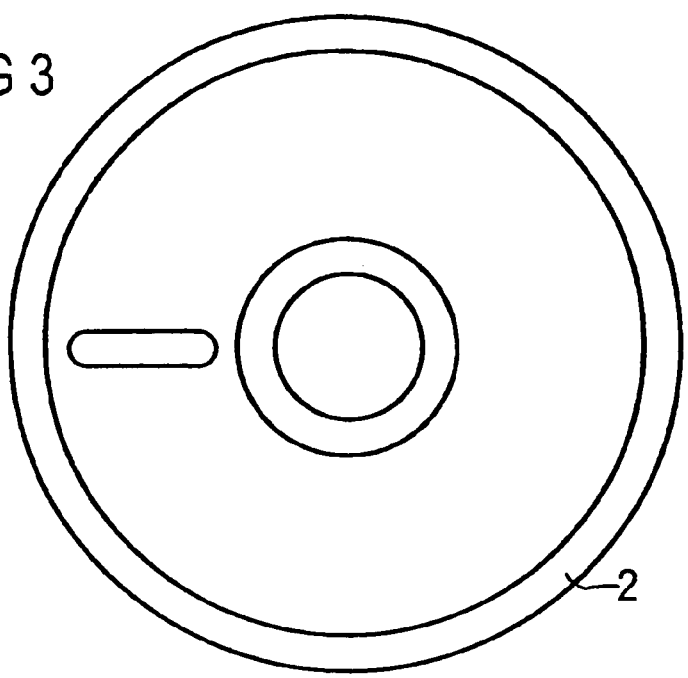
FIG. 3 is a sectional view of the present invention as applied to shielding for a magnetic disk
Figure 4:
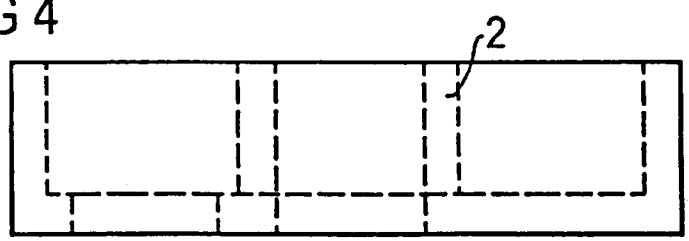
FIG. 4 is a cross section of the magnetic disk depicted in FIG. 3

FIGS. 3 and 4 depict a magnetic disk manufactured according to the present invention. Herein the disk, preferably a magnetic disk, includes an electromagnetic field with the above frequencies (above 100 kHz) and manufactured with the equivalent materials discussed above with respect to FIGS. 1 and 2. Other applications may include a coil, circuit and the like.

Figure 5:
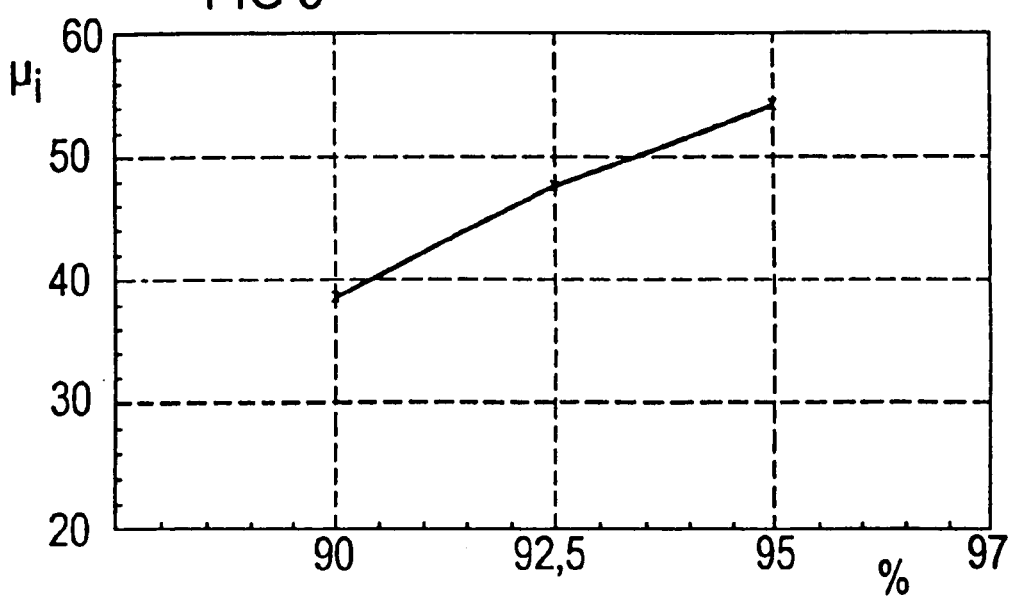
FIG. 5 is a diagram depicting permeability of materials applied in accordance with the present invention.

FIG. 5 depicts the initial permeability of a product built according to the above specifications versus the percentage or density of ferrite. The abscissa refers to permeability while the ordinate refers to the ferrite percentage. FIG. 6 depicts the interdependence of permeability with frequency of a magnetic field impinging upon a solid. The permeability is in essence a complex valence of the influence of the magnetic field upon the solid. The real component of the graphed permeability, as depicted in FIG. 5, is in effect a proportion of magnetic flux density B and magnetic field strength H as impinging upon the solid. The imaginary component of the graphed permeability sets out dampening or absorption of the magnetic field as applied to the product. Where such loss becomes substantial, a dispersion effect is made upon the magnetic field.

Continuing with FIG. 6, here the effects on a magnetic field of two products of slight composition variation, is depicted. In particular, the imaginary and real components of the permeability measurements discussed above. Like letters refer to like products. The abscissa represents the real and imaginary components of permeability and the ordinate represents a logarithmic scale of frequency. The curves not beginning at the origin refer to the real component of permeability, while the curves beginning at the original refer to the imaginary component. As depicted, at lower frequencies, the real components are practically constant, while the imaginary components are relatively non-existent. At frequencies about 10 MHz, the real components begin to ascend while the imaginary components climb. As such, about 100 MHz, the impinging magnetic field essentially becomes dispersed. Hence, products constructed with the above ferrite density and size effectively shield at about 100 MHz. Such a shielding is particularly useful in the telecommunication arts as the frequencies lie in the pulse range of conventional microprocessors as well as conventional mobile radio units.

The invention being thus described, it will be obvious that the same may be varied in many ways. Such variations are not to be regarded as a departure from the spirit and scope of the invention, and all such modifications would be obvious to one skilled in the art are intended to be included within the scope of the following claims.

We claim:

1. A method for producing a magnetic device, comprising the steps of:
   forming ferromagnetic grains having an average diameter of about 100 microns, the grains including first and second groups of grains, the first group having an average diameter of about 8 millimeters and the second group having an average diameter of about 2 millimeters; and
   embedding the grains in a matrix, the matrix including a hardening material.

2. The method according to claim 1, wherein the ferromagnetic grains include ferrite.

3. The method according to claim 2, wherein the ferrite is sintered.

4. The method according to claim 1, wherein the hardening material includes cement.

5. The method according to claim 1, wherein the magnetic device is a shield for frequencies in the range of approximately 100 kHz and above.

6. The method according to claim 1, wherein the grains have a minimum of about 10 microns.

7. The method according to claim 1, wherein the magnetic device is a plaster.

8. The method according to claim 1, wherein the magnetic device is an electromagnetic shield.

* * * * *